United States Patent [19]

Miyagi et al.

[11] Patent Number: 5,764,119
[45] Date of Patent: Jun. 9, 1998

[54] WIRING BOARD FOR HIGH-FREQUENCY SIGNALS AND SEMICONDUCTOR MODULE FOR HIGH-FREQUENCY SIGNALS USING THE WIRING BOARD

[75] Inventors: Takeshi Miyagi, Fujisawa; Yuji Iseki, Yokohama; Yasushi Shizuki, Yokohama; Kunio Yoshihara, Yokohama; Masayuki Saito, Yokohama; Kazuhito Higuchi, Yokohama; Takeshi Hanawa, Yokohama; Eiji Takagi, Yokosuka, all of Japan

[73] Assignee: Kabushiki Kaisha Toshiba, Kawasaki, Japan

[21] Appl. No.: 725,167

[22] Filed: Oct. 3, 1996

[30] Foreign Application Priority Data

Oct. 16, 1995 [JP] Japan ............... 7-267014
May 15, 1996 [JP] Japan ............... 8-120477
Sep. 11, 1996 [JP] Japan ............... 8-240527

[51] Int. Cl.$^6$ ............................................. H01P 3/08
[52] U.S. Cl. ................ 333/238; 174/250; 333/247; 361/767
[58] Field of Search .......................... 333/238, 247; 361/748, 746, 750, 762, 767, 771, 772, 774, 792, 794, 795; 174/110 R, 110 B, 110 FC, 117 R, 117 F, 117 FF, 250, 253, 255, 256, 258, 254, 261

[56] References Cited

U.S. PATENT DOCUMENTS 3,702,427  11/1972  Learn et al. ............... 174/253 X
5,046,238   9/1991  Daigle et al. .............. 361/792 X
5,329,423   7/1994  Scholz ..................... 361/792 X
5,426,399   6/1995  Matsubayashi et al. ....... 333/238 X
5,451,722   9/1995  Gregoire .................. 174/261

OTHER PUBLICATIONS

Dinella, Method Of Grounding A Printed Circuit Board Western Electric Technical Digest No. 16, p. 1, Oct. 1969.

Takeshi Toda, et al. "Characteristics of U–Grooved Microstrip Lines", Proceeding of the 1994 Electronics Society Conference of IEICE, C–144, (p. 2–649), 1994.

*Primary Examiner*—Paul Gensler
*Attorney, Agent, or Firm*—Oblon, Spivak, McClelland, Maier & Neustadt, P.C.

[57] ABSTRACT

A wiring board for high-frequency signals, which comprises, a substrate, a dielectric layer formed on the substrate and provided on its surface with a U-shaped groove having an arcuate bottom for forming a wiring therein, and a signal wiring formed in the U-shaped groove, which is featured in that an upper end portion of the signal wiring is protruded out of the surface of the dielectric layer. A distance (H) from a protruded top surface of the signal wiring to a bottom of the U-shaped groove and a width (W) of the U-shaped groove preferably meet a relationship of 2<(W/H)<50, and the height of the portion of signal wiring which is protruded out of the surface of the dielectric layer is preferably in the range of 10 nm to 10 μm.

30 Claims, 9 Drawing Sheets

WIRING BOARD FOR HIGH-FREQUENCY SIGNALS AND SEMICONDUCTOR MODULE FOR HIGH-FREQUENCY SIGNALS USING THE WIRING BOARD

BACKGROUND OF THE INVENTION

1. Field of the Invention

This invention relates to a wiring board and an integrated circuit, which are adapted for dealing with signals of a high-frequency wave such as microwave and millimetric-wave band, and in particular to an internal wiring structure of the wiring board and integrated circuit.

2. Description of the Related Art

As represented by the mobile radio and satellite communication, the field of radiocommunication has been increasingly expanding in recent years. Under the circumstances, the frequency to be utilized in the data communication becomes increasingly higher, so that there is an increasing trend that signals of higher frequency are required to be processed by the transmitter-receiver to be used for the data communication.

The transmitter-receiver is generally provided with a printed wiring board on which a predetermined circuit pattern is formed together with various parts such as ICs and passive components mounted on the circuit pattern. This circuit pattern is generally formed by etching the copper foil formed on the surface of the printed wiring board. Likewise, the circuit pattern of an integrated circuit is formed by patterning a thin film by making use of a photolithography, the thin film being usually formed by way of a vacuum processing such as sputtering.

Figure 1:
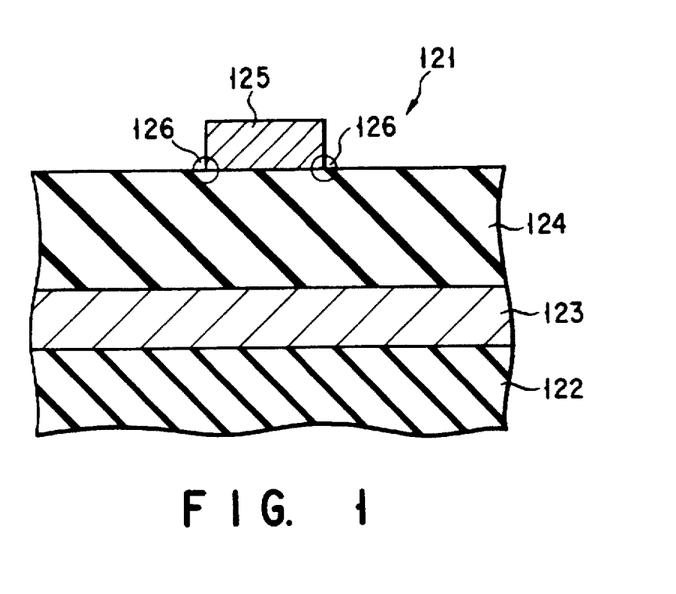
FIG. 1 is a cross-sectional view showing a conventional wiring board.

The pattern, in particular a wiring formed in this manner, has a rectangular cross-sectional shape as shown in FIG. 1, so that the cross-section of the wiring (for example, a signal wiring) are inevitably accompanied with four corner portions 126. In FIG. 1, the reference numeral 125 denotes a signal wiring and 124 a dielectric layer. The presence of these corner portions 126 however may become a cause for deteriorating electric properties in the propagation of high-frequency signals. Namely, as high-frequency signals are propagated through a wiring in a microstrip structure, an electric current is concentrated at both corner portions 126 positioned adjacent to the ground layer, resulting in an increase in loss of the current.

Studies are now performed in various places to solve this problem. For example, studies on this problem are reported in the National Spring Meeting of the Institute of Electronics, Information and Communication on Engineers, SC-2-9; 1991, "Multi-layered MMIC Transmission Rout"; and in the National Spring Meeting of the Institute of Electronics, Information and Communication on Engineers, C-144; 1994, "Property Analysis of a U-groove Microstrip Lines". According to the latter, a signal wiring 125 is formed on the surface of the groove of a dielectric layer 124 as shown in FIG. 2, and it is reported that the loss of current can be minimized as compared with the conventional wiring of rectangular cross-section.

Figure 2:
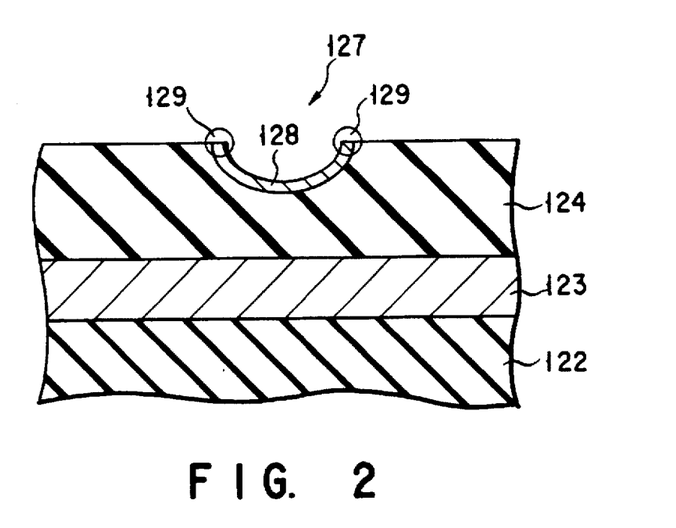
FIG. 2 is a cross-sectional view showing a conventional wiring board.

However, in the structure shown in FIG. 2, since the end portion 129 of a signal wiring 128 is contacted with the dielectric layer 124, the concentration of electric current is generated at this portion, thus making it impossible to obtain a uniform current distribution. Accordingly, a current loss is caused to generate, thus deteriorating the electric property of the wiring.

Moreover, since the film thickness of the wiring pattern for high-frequency signal is extremely small in the structure shown in FIG. 2, there is a problem in terms of processing. Generally, a wiring pattern of high frequency signal and the patterns for power wiring and DC signal wiring are disposed together in the same layer. In this case, all patterns excluding the wiring pattern for high frequency signal are required to be formed to have a large cross-sectional area in order to minimize the DC resistance. In the case of the structure shown in FIG. 2, all of the patterns disposed in the same layer are formed as thin as that of the wiring pattern for high frequency signal, so that it is impossible to minimize the resistance. If it is desired to enlarge the cross-sectional area of the wirings other than that of the wiring pattern for high frequency signal, the patterns for power wiring and DC signal wiring are required to be formed in a separate step from that of the wiring pattern for high frequency signal in spite of the fact that all of them are disposed in the same layer. The employment of dual steps will naturally result in reduction of yield and increase manufacturing cost.

In spite of a persistent demand for a wiring board for high frequency signal, which has excellent electric properties and can be manufactured in a simplified process, such a demand is not fulfilled as yet.

In a data transmission between computers or between a mobile portable terminal and a computer, further improvements in terms of very high speed and large capacity are now demanded. Further, since multimedia is directed mainly to civilian demands, demands for lowering the cost for the apparatus to be employed for the data transmission are also strong.

The hardware to be mainly employed in these apparatus are LSI such as microprocessor and memory, and a high-frequency component such as MMIC. These semiconductor chips are generally housed in a package, which is then mounted on a printed wiring board.

However, with the advancements of speeding-up and large capacity of data transmission, the conventional mounting method of these semiconductor chips becomes unsuitable for coping with these advancements. For example, because of the speeding-up of clock frequency or because of more increased frequency in radiocommunication frequency, there have been raised various problems in the employment of the conventional printed wiring board. Namely, since epoxy resin is employed as a material for the substrate, the delay in transmission of signals becomes prominent, and at the same time the loss of high frequency signals becomes also prominent. With a view of improving the electric properties toward the wiring board, it is now required to adopt a flip chip-mounting wherein a projected electrode, or a so-called bump, is formed on the electrode pad of an LSI and the resultant LSI chip is directly mounted on a substrate. However, since it is difficult in the case of the conventional printed wiring board to form a very fine wiring or pad, there is another problem in the conventional printed board that it is impossible to form a fine wiring pattern whose pitch is not more than 100 microns which is required for adopting the flip chip-mounting method. In an attempt to solve this problem, a build-up type substrate has been proposed and actually employed, wherein a multi-layered wiring consisting of fine metallic wirings formed through a thin film technique and epoxy resin insulating films functioning as an insulating interlayer is formed on a printed wiring board, thus making it possible to meet the requirements for the flip chip-mounting. However, there is still a problem in this build-up type substrate that if a high speed digital signal or a high-frequency signal in the order of several tens GHz is to be dealt with by a printed circuit board, a material which is superior in electric properties than epoxy resin is required to be employed as a dielectric material in place of epoxy resin. Unless such a material is not employed, it would be impossible to obtain a printed circuit board which is capable of dealing with such a high speed and high-frequency signal. Because of these reasons, benzocyclobutene (BCB) which is superior in all of electric, mechanical and thermal properties has been developed by Dow Chemical Co. and the application of this BCB to the build-up type substrate is now studied in various institutes.

A multi-layered wiring board employing this BCB can be manufactured by making use of a photo-etching method as explained below.

FIGS. 3A to 3D illustrate a method of manufacturing the conventional wiring board employing BCB.

Figure 3A:
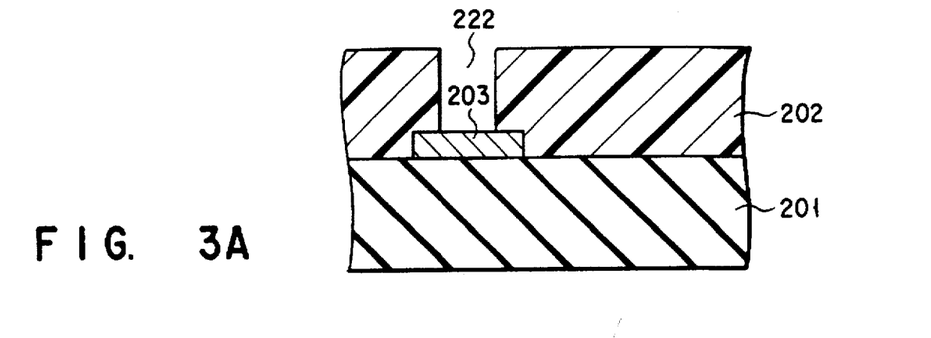
FIGS. 3A to 3D are cross-sectional views illustrating method of manufacturing a conventional wiring board employing BCB.

As shown in FIG. 3A, a first wiring 203 is formed in advance on the surface of a substrate to obtain a printed substrate 201. Then, a film of a photosensitive BCB resin 202 is formed on the surface of the substrate 201 by means of a spin-coating method. Thereafter, a pre-baking, light exposure and development are successively performed under a predetermined conditions thereby carrying out a patterning to form a contact hole 222.

Figure 3B:
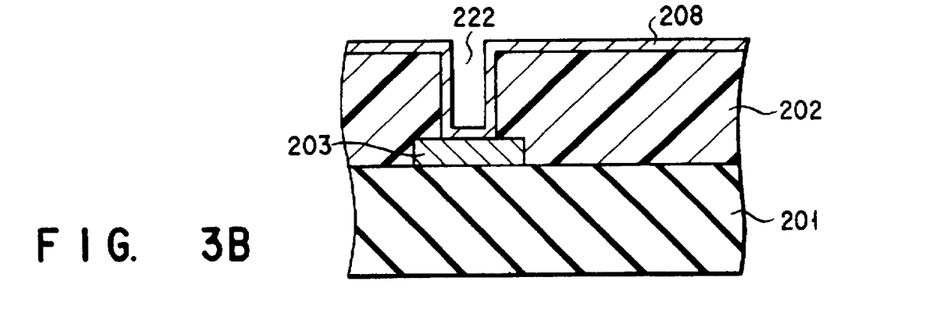

Then, as shown in FIG. 3B, a metallic film 208 consisting of copper for instance is formed on this patterned BCB film by means of sputtering method or vapor deposition method.

Figure 3C:
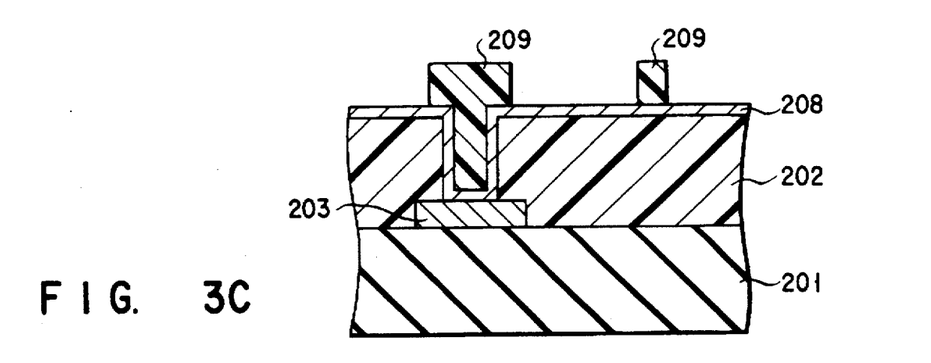

Subsequently, a resist layer is formed by means of a spin-coating method on the metallic film 208 and then the resist layer is patterned to form a resist pattern 209 as shown in FIG. 3C.

Figure 3D:
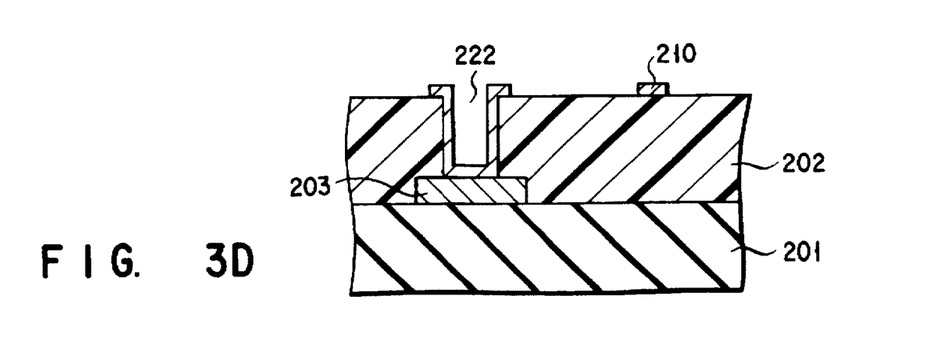

Then, etching is performed with the resist pattern 209 being employed as a mask to remove an unnecessary portion of the metallic layer 208, and subsequently the resist pattern 209 is also removed to obtain a multi-layered wiring board as shown in FIG. 3D.

This conventional method however is accompanied with problems that since a photoetching process is employed, the number of manufacturing steps will be increased, thus inviting an increase in manufacturing cost, and that since the etching solution and the resist material are harmful to human body, the employment of these materials are not preferable in view of environmental protection. Moreover, the conventional wiring board is defective in adhesion strength between the BCB film and the metallic film, so that an improvement on reliability in this regard has been required.

SUMMARY OF THE INVENTION

Accordingly, an object of the present invention is to provide a wiring board for high-frequency signals, which is excellent in electric properties and capable of greatly reducing the loss of electric current, and which can be manufactured without accompanying any complicated process, thus saving the manufacturing cost thereof.

Namely, according to the present invention, there is provided a wiring board for high-frequency signals, which comprises;

a substrate;

a dielectric layer supported by the substrate and provided on its surface with a U-shaped groove having an arcuate bottom for forming a wiring therein; and a signal wiring formed in the U-shaped groove in such a manner that an upper end portion of the signal wiring is protruded out of the surface of the dielectric layer.

According to the present invention, there is further provided a wiring board for high-frequency signals, which comprises;

a substrate;

a photo-sensitive benzocyclobutene layer supported by the substrate and provided on its surface with a U-shaped groove having an arcuate bottom for forming a wiring therein;

a chromium thin film formed on the U-shaped groove of the photo-sensitive benzocyclobutene layer; and a signal wiring comprising copper and formed in the U-shaped groove in such a manner that an upper end portion of the signal wiring is protruded out of the surface of the photo-sensitive benzocyclobutene layer.

Further, according to the present invention, there is also provided a semiconductor module for high-frequency signals, which comprises;

a substrate provided on its underside surface with a first conductive connector;

a dielectric layer supported by the substrate and provided on its surface with a U-shaped groove having an arcuate bottom for forming a wiring therein;

a semiconductor element mounted on the dielectric layer by making use of a second conductive connector; and a signal wiring formed in the U-shaped groove in such a manner that an upper end portion of the signal wiring is protruded out of the surface of the dielectric layer.

Moreover, according to the present invention, there is further provided a wiring board for high-frequency signals, which comprises:

a first wiring substrate comprising a first substrate; a first dielectric layer supported by the first substrate and provided on its surface with a U-shaped groove having an arcuate bottom for forming a wiring therein; and a first signal wiring formed in the U-shaped groove in such a manner that an upper end portion of the first signal wiring is protruded out of the surface of the first dielectric layer; and a second wiring substrate comprising a second substrate; a second dielectric layer supported by the second substrate and provided on its surface with a U-shaped groove having an arcuate bottom for forming a wiring therein; and a second signal wiring formed in the U-shaped groove in such a manner that an upper end portion of the second signal wiring is protruded out of the surface of the second dielectric layer;

wherein the upper end portion of the first signal wiring is disposed in separate from and to face the upper end portion of the second signal wiring.

The wiring board according to this invention can be manufactured by a method comprising the steps of; forming a benzocyclobutene insulating film on a surface of a substrate where a wiring layer is formed in advance; patterning the insulating film; forming a metallic film on the patterned benzocyclobutene insulating film; forming a plating on the metallic film; and abrading the plating to remove an unnecessary portion of the plating.

At least the surface portion of the aforementioned metallic film which is to be contacted with the benzocyclobutene insulating film should preferably be composed of a Cr layer.

It is preferable that the surface of the benzocyclobutene insulating film is pretreated with plasma using a nitrogen gas prior to the step of forming the metallic film.

It is also preferable that the substrate deposited with the metallic film and the benzocyclobutene insulating film are heat-treated at a temperature of 230° to 270° C. in subsequent to the step of forming the metallic film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

According to a wiring board for high-frequency signals of this invention, a groove which is constituted by a continuous curved inner surface (hereinafter referred to as a U-shaped groove having an arcuate bottom) is formed on the surface of a dielectric layer formed in advance on a substrate, and a signal wiring is formed in this groove in such a manner that the upper corner portions of the signal wiring are exposed to be surrounded by air atmosphere. Accordingly, the signal wiring is contacted via the curved portion of the wiring with the dielectric layer. As a result, the concentration of electric current at a portion of the signal wiring as in the case of the conventional wiring board can be prevented and hence the increase of the loss of electric current can be avoided, thus making it possible to provide a high-frequency device excellent in electric properties.

Furthermore, since the signal wiring is formed in such a manner as to completely fill the groove formed in the dielectric layer, the pattern for high-frequency signal wiring can be formed concurrently with the patterns for power source wiring and DC signal wiring in the same steps. As a result, the number of step can be minimized, thus simplifying the manufacturing process and, at the same time, improving the yield, whereby saving the manufacturing cost of the wiring board.

This invention will be explained further with reference to drawings.

Figure 4:
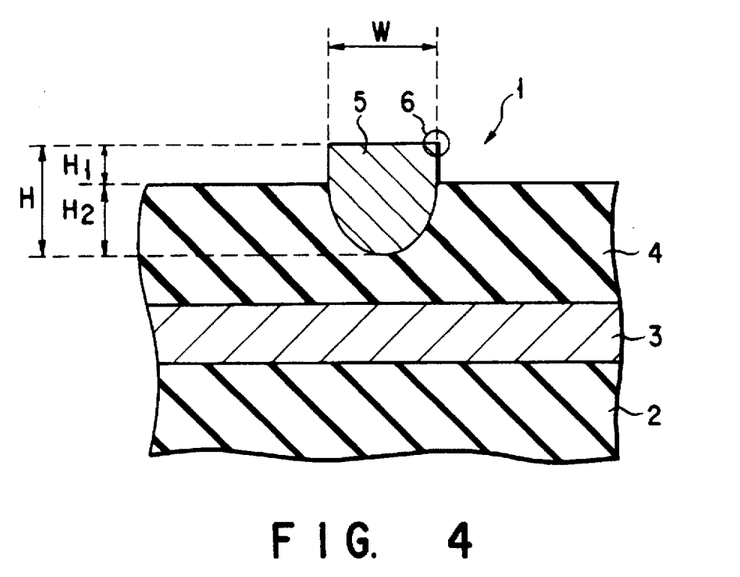
FIG. 4 is cross-sectional view showing one example of a wiring board for high-frequency signals according to this invention.

FIG. 4 illustrates a cross-section of one example of the wiring board according to this invention. In the wiring board shown in FIG. 4, a ground layer 3 and a dielectric layer 4 are successively formed on a substrate 2. The U-shaped groove constituted by a continuous curved surface and formed in the dielectric layer 4 is filled with a signal wiring 5 at a depth of $H_2$. Further, the top surface of the signal wiring 5 is protruded at a height of $H_1$ from the surface of the dielectric layer 4. Namely, the distance from the protruded end of the signal wiring 5 to the bottom of the groove can be represented by H ($=H_1+H_2$) corresponding to the thickness of the signal wiring.

As apparent from FIG. 4, according to the wiring board of this invention, the signal wiring 5 is contacted with the dielectric layer 4 only via a curved surface of the signal wiring 5, and hence there is no angled portion in the contacting surface between the dielectric layer 4 and the signal wiring 5, thus making it possible to avoid the concentration of electric current at a particular portion of the signal wiring 5. Moreover, since the angled end portions 6 of signal wiring 5 are spaced apart from the dielectric layer 4 and disposed in air atmosphere, the line of electric force generating from these angled end portions can be extremely minimized, thus further minimizing the concentration of electric current.

Furthermore, since the groove formed in the dielectric layer 4 is completely filled with a metal, the wiring is low in resistance in terms of DC. According to the aforementioned wiring board, the pattern for high-frequency signal wiring can be formed concurrently with patterns for power source wiring and DC signal wiring in the same step, so that the simplification of manufacturing process, improvement of yield as well as the saving of manufacturing cost can be realized.

The wiring board of this invention shown in FIG. 4 can be manufactured as follows for instance.

First of all, a metallic film for forming the ground layer 3 is formed on the substrate 2. In this case, a semiconductor substrate or an insulating substrate can be employed for the substrate 2. When a semiconductor substrate or a ceramic substrate is employed as the substrate 2, a metallic film consisting for example of Al, Cu, or Au can be formed by means of a sputtering method. In the case of a printed substrate, a copper foil formed in advance on the surface of the substrate can be utilized. This metallic film may be patterned, if required, by way of photolithography.

Then, the dielectric layer 4 is formed on the ground layer 3. As for the material for the dielectric layer 4, polyimide, $SiO_2$ or epoxy resin may be employed, but benzocyclobutene (BCB) is most preferable as a material for the dielectric layer 4. This BCB is excellent in electric property, i.e. low in dielectric constant (2.7) and in dielectric dissipation factor (0.0008), and has satisfactory mechanical and thermal properties suited for use as the dielectric layer 4.

The employment of a photosensitive BCB resin is also preferable in view of simplifying the manufacturing process. Namely, the BCB film can be formed as follows by making use of a photosensitive BCB resin. First of all, the BCB resin is coated on a substrate by means of spin coating to form a film 10 μm in thickness. The film thickness of this BCB film may be optionally selected depending on the characteristic impedance required. However, in view of at least avoiding the generation of pin hole, the film thickness should preferably be 1 μm or more. Then, the resultant BCB film is pre-baked at a temperature ranging from 60° to 90° C., more preferably 80° C., and subsequently exposed via a predetermined mask pattern to ultraviolet rays having a peak at 365 nm. Thereafter, the BCB film is subjected to a developing treatment using an organic BCB-developing solution (Dow Chemical Co.) so as to selectively remove the BCB film to a depth which corresponds to the thickness of the signal wiring, i.e. H ($H=H_1+H_2$).

Herein $H_1$ represents the thickness of the upper portion of the signal wiring 5 that is protruded out of the dielectric layer 4, and $H_2$ is the thickness of the other portion of the signal wiring 5 that is buried in the dielectric layer 4. The dimension of $H_1$ should preferably be in the range of 10 nm to 10 μm, more preferably 100 nm to 1 μm. If the dimension of $H_1$ is less than 10 nm, the effect of this invention may not be realized, and at the same time, the control of the film thickness may become very difficult. On the other hand, if the dimension of $H_1$ exceeds 10 μm, the line of electric force generating from the signal wiring 5 may be concentrated at the bottom portion of the signal wiring 5. The dimension of $H_2$ may be suitably selected depending on the limitation for example on the thickness of the substrate. For example, if the wiring board is required to be minimized in size and weight for the purpose of manufacturing a portable telephone, $H_2$ may preferably be in the range of 3 to 5 μm.

The selective etching of the BCB film should be carried out so as to form a groove which is constituted exclusively by a continuous curved surface, or a U-shaped groove having an arcuate bottom.

Specifically, the U-shaped groove having an arcuate bottom should be formed into a shape where the ratio between the width of the groove (the width of the signal wiring) "W" and the thickness of the wiring "H", i.e. (W/H) falls within the range of 2 to 50. If the ratio is less than 2, the formation of the U-shaped groove may become extremely difficult. On the other hand, if the ratio exceeds over 50, the formation of the arcuate bottom may become impossible. A more preferable range of the ratio between the width of the signal wiring "W", and the thickness of the wiring "H", i.e. (W/H) is 10 to 20.

Subsequently, the BCB film is hard-cured at a temperature of 210° to 280° C. for instance, more preferably 250° C. to form a BCB film provided on its surface with a U-shaped groove.

Then, a copper thin film 0.8 to 1.5 μm in thickness is formed all over the surface of the BCB film by means of a sputtering method or a vacuum deposition method. Thereafter, an electroplating is performed by making use of this copper thin film as an electrode until the U-shaped groove having a depth of "H" and formed in the BCB film is completely filled with copper, thereby forming a copper film on the BCB film.

All of the copper film excluding that formed on the U-shaped groove is then removed by ways of etching or abrasion. Preferably, this removal of the copper film should be performed by way of an abrasion method in view of saving the time required for this removing step and avoiding the environmental problem. In particular, the employment of buffing which is generally performed in the manufacture of a printed substrate is more preferable in this case. By performing the abrasion of the copper film until the surface of the BCB film is exposed, a signal wiring 5 consisting of the copper deposition that is left only in the U-shaped groove of the dielectric layer 4 can be formed.

Finally, the BCB film is etched to a depth corresponding to the height of $H_1$ by means of a plasma etching method such as RIE. In this case, the BCB film may be etched at a high speed by making use of a mixed gas comprising $O_2$ and $CF_4$.

With these steps, the wiring board 1 provided with the signal wiring 5 having a protruded surface portion and contacting with the dielectric layer 4 only through a curved surface of the wiring as shown in FIG. 4 can be obtained.

Figure 5:
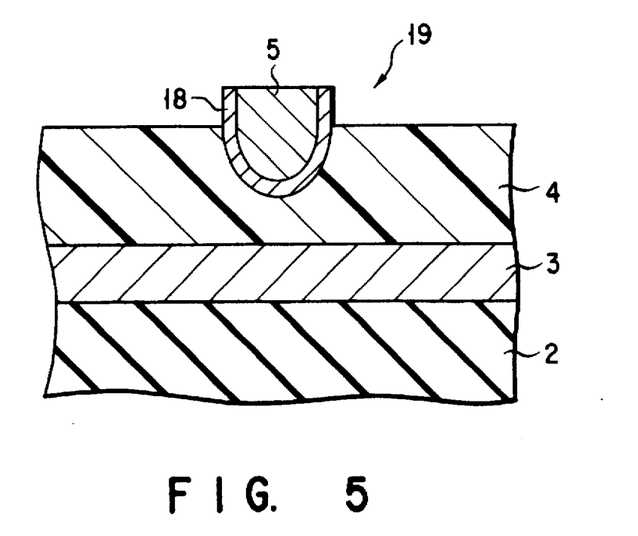
FIG. 5 is a cross-sectional view showing another example of a wiring board for high-frequency signals according to this invention.

When a BCB film is employed as the dielectric film 4 and copper is employed as a material for the signal wiring 5, an interposition of a chromium thin film 18 between the BCB film and the signal wiring 5 as shown in FIG. 5 may be more preferable, since the interposition of the chromium thin film 18 will strengthen the adhesion between the wiring and the BCB film.

Next, a method of manufacturing a wiring board shown in FIG. 5 will be explained with reference to FIGS. 6A to 6D.

Figure 6A:
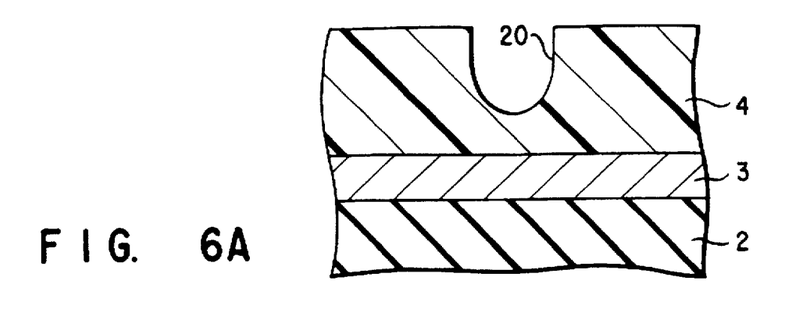
FIGS. 6A to 6D are cross-sectional views illustrating a method of manufacturing a wiring board for high-frequency signals according to this invention.

First of all, the ground layer 3 and the BCB film are successively formed on the substrate 2. As for the material for the ground layer 3, the same materials as explained in the above embodiment can be used. The ground layer 3 and the BCB film may be formed in the same manner as explained above.

The thickness of the BCB film to be formed in this case should be 1 to 15 μm if it is formed as a single layer, and should be at most 50 μm in total if it is formed as plural layers. If the film thickness of the single layer is less than 1 μm, a pin hole may be generated. On the other hand, if the film thickness exceeds over 15 μm, the yield in the process of light exposure and development would be deteriorated. If the total thickness of the BCB film exceeds over 50 μm, cracks may be developed in the film.

Then, the resultant BCB film is pre-baked at a temperature of 80° C. for instance, and subsequently exposed to a light of 600 mJ for instance. Thereafter, the BCB film is subjected to a developing treatment for patterning the BCB film to form a groove 20, thereby obtaining a cross-section shape as shown in FIG. 6A.

Figure 6B:
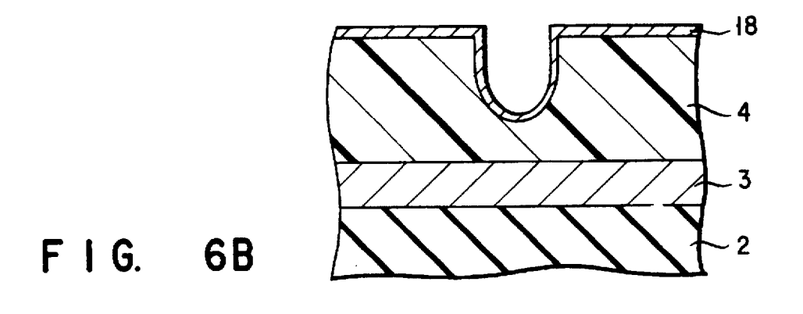

Subsequently, as shown in FIG. 6B, the chromium thin film 18 for a copper plating is formed by means of a vacuum deposition for instance. The thickness of the chromium thin film 18 in this case should preferably be in the range of 10 nm to 1 μm, more preferably in the range of 20 nm to 200 nm. If the thickness of the chromium thin film 18 is less than 10 nm, it may be difficult to sufficiently improve the adhesion between the BCB film and the copper wiring. On the other hand, if the thickness of the chromium thin film 18 exceeds over 1 μm, the electric property of the wiring may be badly affected due to a skin effect.

When the surface of the BCB film is subjected to a plasma treatment by making use of nitrogen gas prior to the deposition of the chromium thin film 18, the adhesion strength between the BCB film and a metallic film will be enhanced to a preferable extent.

Figure 6C:
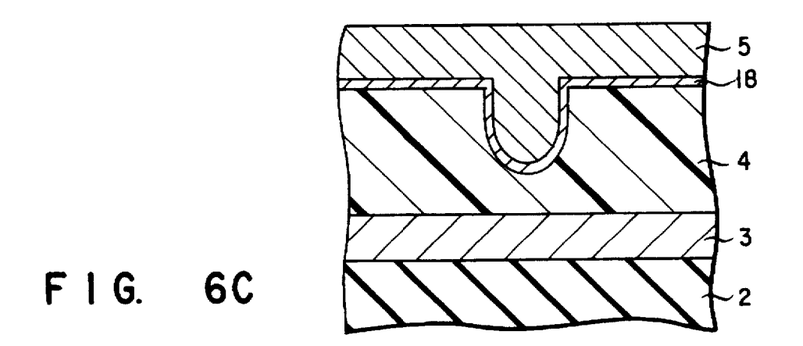

Thereafter, an electroplating is performed by making use of this chromium thin film 18 as an electrode until the U-shaped groove 20 is completely filled with copper, thereby forming a copper film 5 on the chromium thin film 18 as shown in FIG. 6C.

Figure 6D:
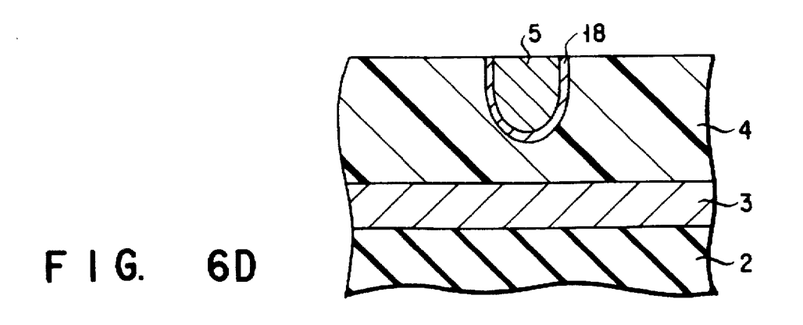

All of the copper film excluding that formed on the U-shaped groove 20 is then removed by means of etching or abrasion. Preferably, this removal of the copper film should be performed by means of abrasion in view of saving the time required for this removing step and avoiding the environmental problem. In particular, the employment of buffing which is generally performed in the manufacture of a printed substrate is more preferable in this case. By performing the abrasion of the copper film together with the chromium thin film 18 until the surface of the BCB film is exposed, a signal wiring 5 consisting of the copper deposition that is left via the chromium thin film 18 only in the U-shaped groove of the dielectric layer 4 can be formed as shown in FIG. 6D. Furthermore, the employment of abrasion method is more advantageous than an etching method, since the surface of the resultant body will be entirely flattened.

Finally, the BCB film is etched to a predetermined depth by means of a plasma etching method such as RIE using a mixed gas comprising $O_2$ and $CF_4$, thereby obtaining a wiring board 19 as shown in FIG. 5.

It may be preferable to heat-treat the substrate deposited with the metallic film and the BCB film at a temperature of 230° to 270° C. after the deposition of the metallic film, since such a heat-treatment would further enhance the adhesion between the metallic film and the BCB film.

When a chromium thin film is interposed between the signal wiring made of copper and the BCB film, the adhesion strength between the BCB film and the copper film can be greatly enhanced, thus making it possible to obtain a wiring board excellent in reliability. Moreover, since the wiring can be buried by making use of a mechanical abrasion, the process of forming the wiring can be simplified as compared with the conventional process of employing a photoetching method, thus saving the manufacturing cost of the wiring board.

The present inventors have carried out many experiments under various conditions, finally succeeding to obtain an electrode film having a high adhesion strength which is 200 times as high as that can be generally obtained from an adhesion between the BCB film and a copper film. The method of forming such an electrode film will be explained in detail as follows.

First of all, a U-shaped groove is formed on the surface of a BCB film, and then the surface of a BCB film is subjected to a plasma treatment using various kinds of gas prior to the formation of a metallic film in the U-shaped groove. Subsequently, a metallic film is formed in the U-shaped groove of the BCB film. Then, the adhesion strength between the metallic film and the BCB film was measured.

Figure 7:
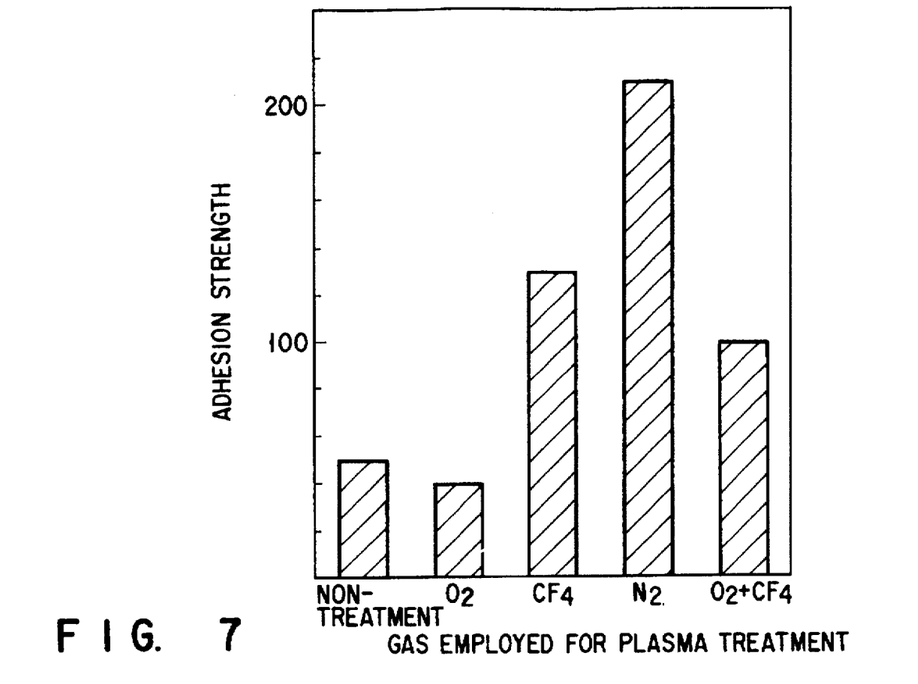
FIG. 7 is a graph showing the relationship between the gas employed for a plasma treatment and the strength of adhesion.

FIG. 7 is a graph illustrating the relationship between the gas employed in the plasma treatment and the adhesion strength between the metallic film and the BCB film. In this experiment, a Cr film was employed as the metallic film. The measurement of the adhesion strength was all performed by making use of a right angle peeling test, which is commonly employed in testing the adhesion between a copper foil and a substrate in the field of printed wiring board. The adhesion strength in this experiment was indicated as a ratio wherein the adhesion strength between the BCB film and the copper film was assumed as being 1. It will be seen from FIG. 7 that $N_2$ gas is excellent as a gas to be employed in the plasma treatment.

Figure 8:
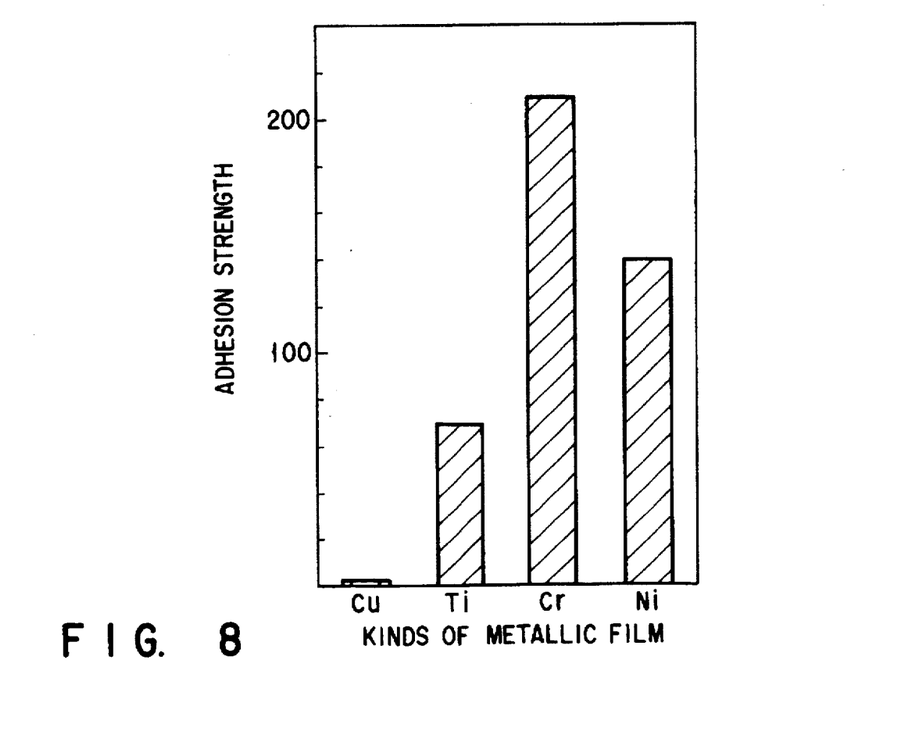
FIG. 8 is a graph showing the relationship between the kinds of metallic films forced on a BCB insulating film and the strength of adhesion.

After the surface of the BCB film was subjected to the plasma treatment using $N_2$ gas, various kinds of metal were deposited on the surface of the BCB film to investigate the adhesion strength between the metallic film and the BCB film in the same manner as explained above. FIG. 8 illustrates the relationship between the kinds of metallic film and the adhesion strength. As seen from FIG. 8, the Cr film indicated the highest adhesion strength among various metallic films. Namely, the adhesion strength between the Cr film and the BCB film was 200 times as high as that between the copper film and the BCB film.

Figure 9:
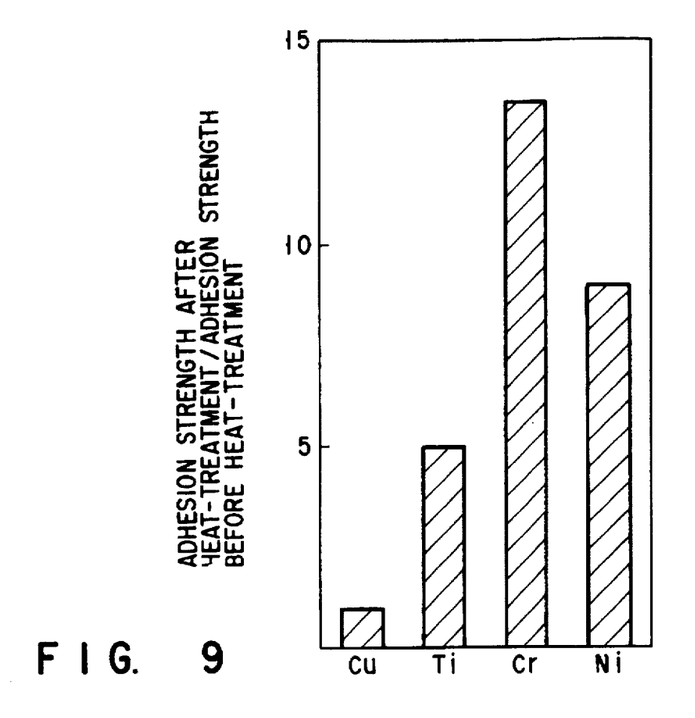
FIG. 9 is a graph illustrating the relationship between the kinds of metallic films and the adhesion strength ratio before and after the heat-treatment.

In another experiment, after various kinds of metals were deposited on the surface of the BCB film which was plasma-treated with $N_2$ gas prior to the deposition of the metals, these metals were heat-treated for 60 minutes at a temperature of 250° C. Subsequently, the ratio in adhesion strength between that before the heat treatment and that after the heat treatment was investigated, the results on these metals are shown in FIG. 9. As seen from FIG. 9, all of metallic films excluding copper film indicated an increased adhesion strength as a result of the heat treatment, which was 5 to 13 times as high as that obtained before the heat treatment.

In the above experiment, the heat treatment was performed at a temperature of 250° C. However, the heat treatment temperature is not confined to 250° C.

Figure 10:
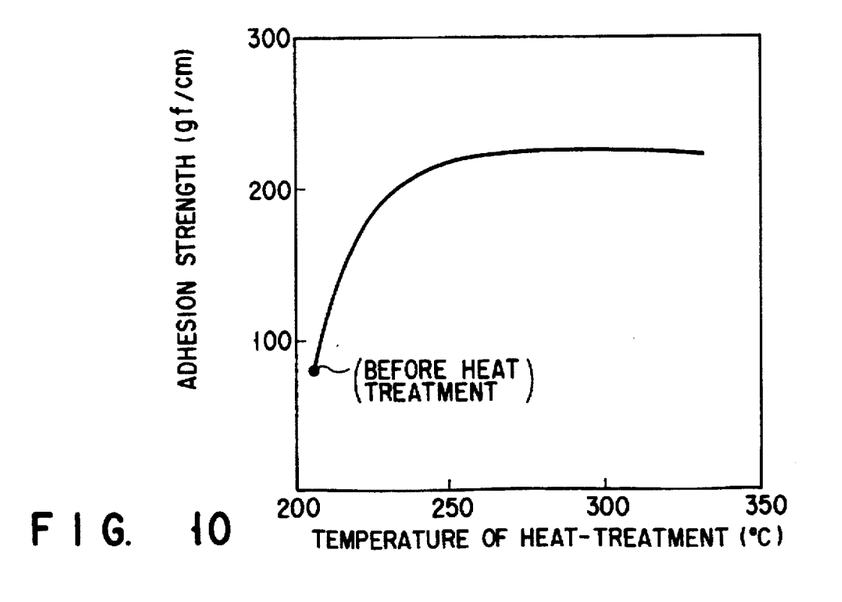
FIG. 10 is graph showing the relationship between the temperature of heat-treatment and the strength of adhesion.

FIG. 10 shows a graph illustrating the relationship between the temperature of heat-treatment and the strength of adhesion in an experiment where a Cr film was formed on the surface of the BCB film which had been plasma-treated with $N_2$ gas in advance, and the heat treatment of the Cr film was performed by selecting the temperature variously. As seen from FIG. 10, the adhesion strength before the heat treatment was 80 gf/cm, but the adhesion strength increased gradually in proportion to the rise in heat treatment temperature, e.g. exceeding over 200 gf/cm, which is sufficient for withstanding against the abrasion, at a temperature of around 220° C. and leveling off at a temperature of around 250° C. However, when the temperature was raised to exceed beyond 300° C., the decomposition of the BCB film was initiated, thus possibly deteriorating the function thereof as an insulating film. Therefore, it will be seen that a preferable range of the heat treatment temperature is from 220° to 300° C.

As explained above, the adhesion strength between the metallic film and the BCB film can be further enhanced by the employment of a Cr as the metallic film, by the plasma treatment of the surface of the BCB insulating film prior to the deposition of a metallic film, or by the heat treatment at a temperature of 220° to 300° C. after the deposition of the metallic film. It should be noted that the adhesion strength which is sufficient for withstanding against the abrasion treatment is about 200 gf/cm, so that if any of aforementioned conditions is met in the process of depositing a metallic film, it is possible to obtain a higher adhesion strength than this value of 200 gf/cm. By the way, if a metallic film is to be employed as a plating electrode and a metal to be plated is copper, this metallic film should preferably be of a laminate structure consisting of Cr (an underlying layer)/Cu. In this case, the thickness of Cr should preferably be in the range of 10 nm to 1 µm, more preferably 20 nm to 200 nm. On the other hand, the thickness of Cu should preferably be in the range of 500 nm to 2 µm, more preferably 800 nm to 1.5 µm.

If a wiring board is manufactured in the aforementioned method, the patterning step of a resist film may be dispensed with, giving various advantages. For example, according to the conventional method of manufacturing a wiring board, the yield of the wiring board is greatly influenced by the accuracy in patterning of a resist film. By contrast, according the aforementioned method of this invention, it is possible to manufacture the wiring board with very high yield. Further, according to the conventional method, an etching solution which is harmful to human body as well as to the environment is employed in the etching step. By contrast, according the aforementioned method of this invention, the employment of a photoresist or an etching solution is not required, so that it is unharmful to human body as well as to the environment.

The aforementioned method of manufacturing a wiring board is also applicable to the manufacture of various kinds of wiring board in addition to the one shown in FIG. 5. For example, a multi-layered wiring board may also be manufactured as follows. Namely, first of all, an insulating film made of benzocyclobutene is formed on a substrate provided in advance with a wiring layer. Then, this benzocyclobutene insulating film is patterned in conformity with a desired shape of a wiring or a via column, thereby forming a groove having a desired depth. Then, a thin metallic film to be employed as a plating electrode is formed on the surface of the benzocyclobutene insulating film provided with the aforementioned groove by means of a vacuum deposition method or a sputtering method. Thereafter, a metal is plated on the thin metallic film thereby simultaneously filling the groove with this plating metal. Then, all of this deposited plating metal excluding that formed over the groove is removed by means of an abrasion method. These steps starting from the step of forming the benzocyclobutene insulating film and ending with the step of removing an unnecessary portion of the plating metal are repeated to accomplish the manufacture of the multi-layered wiring board.

Figure 11A:
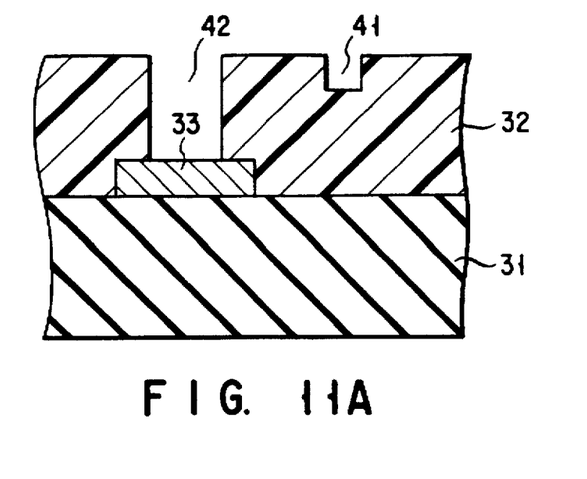
FIGS. 11A to 11C are cross-sectional views illustrating a method of manufacturing another kind of wiring board wherein the method of manufacturing the wiring board according to this invention is applied.
Figure 11B:
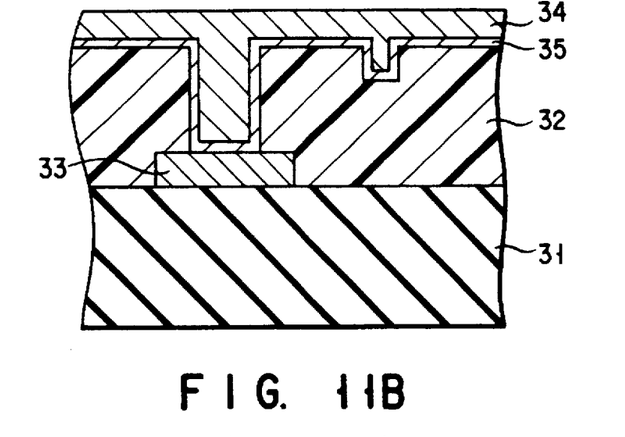
Figure 11C:
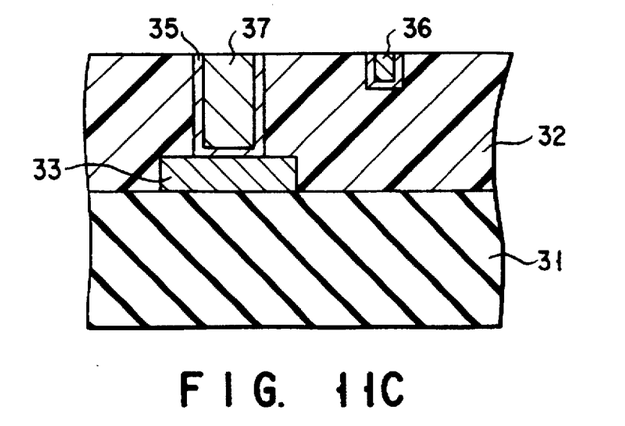

This method will be explained more in detail as follows. FIGS. 11A to 11C show cross-sectional views illustrating another example of manufacturing a wiring board.

Since the cure temperature of BCB is as low as 210° to 250° C., an inexpensive printed substrate may also be employed as a base substrate. The printed substrate 31 shown in FIG. 11A is provided on its surface with a first copper wiring 33 in advance. After forming a photosensitive BCB resin film 32 all over the upper surface of the substrate 31 by means of a spin coating method for instance, the resultant film is pre-baked for 20 minutes at a temperature of 80° C. for instance and then exposed to light of 600 mJ for instance. Thereafter, the patterning of the film is performed by means of a development treatment thereby to form grooves 41 and 42, thus obtaining a substrate having a cross-section as shown in FIG. 11A. The shallow groove 41 indicates a portion which will be ultimately turned into a wiring, while the deep groove 42 indicates a portion which will be turned into a via column. The formation of these shallow groove 41 and deep groove 42 as shown in FIG. 11A in a single development step can be realized by adjusting the magnitude of light exposure. For instance, a film for adjusting the magnitude of light exposure may be attached in advance to a predetermined portions of glass mask in the step of light exposure. It should noted in this case that since the photo-sensitive BCB is of negative type, a chromium film is attached onto the mask in such a manner that the portions for forming a groove pattern are prevented from being exposed to light. In this case, the film thickness of the chromium film is suitably selected in conformity with a desired magnitude of light transmission, e.g. 10 nm or less, so as to allow the BCB film to be slightly exposed with light. As a result, a difference in development rate is brought about between the portions where a thin chromium film is formed and the portions where a thick chromium film is formed. By making the most of this phenomenon, the deep groove and the shallow groove can be formed concurrently in a single step. As an alternative means for irradiating a limited amount of light, a fine circular or rectangular pattern of not more than 1 µm in fineness may be formed on a chromium film about 1 µm in thickness which can be used for an ordinary glass mask, whereby allowing the BCB film to be exposed with a limited magnitude of light through this glass mask.

Then, in the same manner as described above, an electrode film 35 for a copper plating is formed by means of a vacuum deposition method on the surface of the BCB film 32 provided with the deep groove 42 and the shallow groove 41. If chromium is employed for this electrode film 35, the adhesion strength between the BCB film 32 and the metallic film can be enhanced as described above. The thickness of the chromium film should preferably be the same as explained above, i.e. in the range of 10 nm to 1 µm, more preferably 20 nm to 200 nm. A plasma treatment with $N_2$ gas may be performed on the surface of this BCB film 32 prior to the deposition of the chromium film so as to enhance the adhesion strength between the metallic film and the BCB film 32.

Then, as shown in FIG. 11B, an electroplating is performed by making use of this metallic film to form a plated film 34. This plating may be performed until the groove 42 is completely filled with the plated film 34. Subsequently, the upper portion of the plated film 34 is mechanically abraded until a wiring 36 and a via column 37 are formed as shown in FIG. 11C. As for the abrasion method, the buffing which is commonly employed in the processing of a printed substrate may be preferably employed in view of saving cost and high precision. Other abrasion methods employing an abrasion apparatus for surface finishing of semiconductor wafer or for lapping the underside of semiconductor wafer may also be adopted.

The aforementioned BCB may be substituted by PFBC (perfluocyclobenzobutane) in the manufacture of the wiring board of this invention. The method of manufacturing a wiring board by making use of this PFBC will be explained in detail as followings.

The process of manufacturing a wiring board by making use of BCB as an insulating film as one embodiment of this invention has been explained above with reference to FIGS. 11A to 11C. This manufacturing process is also applicable to the manufacture of a wiring board using PFBC. Therefore, method of manufacture of a wiring board using PFBC will be explained with reference to the same FIGS. 11A to 11C.

First of all, PFBC is coated all over the upper surface of the substrate 31 by means of a spin coating method for instance, and the resultant film is cured at a temperature of 250° C. Since PFBC is not photo-sensitive, all of the regions excluding the portions where the groove pattern is formed are covered with a patterned photoresist film (not shown) for the purpose of forming a deep groove 42 for forming a via column in the following step.

Thereafter, an etching is performed by means of a vacuum plasma etching method such as RIE by making use of this photoresist film as a mask thereby to form a deep groove 42. The etching of PFBC can be performed by using only $O_2$ gas as a plasma gas. After the photoresist film is peeled off, another patterned photoresist film (not shown) is formed, as in the case of the deep groove 42, for forming a shallow groove 41 for wiring. Then, an etching is performed by means of RIE in such a manner that the etching is terminated at a middle point so as to form the shallow groove 41. Thereafter the same steps are followed as in the case of BCB to form a plating electrode 35 by means of a sputtering method for instance.

Then, an electroplating of copper for instance is performed and subsequently the upper superfluous portion of the plated film is mechanically abraded to obtain a substrate employing PFBC as an insulating film.

The employment of PFBC as an insulating film is advantageous in that a wiring board having more excellent electric properties than those to be obtained by the employment of BCB can be obtained, since PFBC is lower in dielectric constant and in dielectric dissipation factor as compared with BCB.

Figure 12:
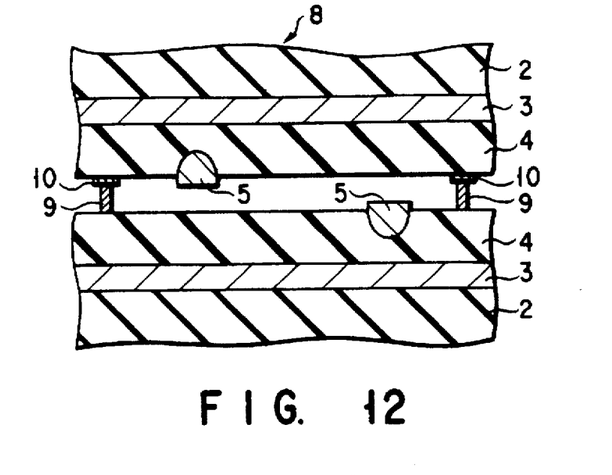
FIG. 12 is a cross-sectional view showing another example of a wiring board according to this invention.

The wiring board of this invention may be employed not only as a single body, but also as a composite body comprising a combination of a pair of wiring boards as shown in FIG. 12. Namely, the composite wiring board 8 shown in FIG. 12 is composed of a pair of the wiring board components shown in FIG. 4 which are superimposed in such a manner that the dielectric layers 4 each provided with the buried signal wiring 5 are directed to face each other. In this case, these wiring board components are required to be arranged such that each signal wiring 5 formed on the wiring board component would not contact with the dielectric layer 4 of the other wiring board component, which is disposed to face the signal wiring 5. This is because, if the signal wiring is contacted with the dielectric layer 4 of the other wiring board component, the line of electric force is generated from the signal wiring to the opposed ground layer thereby allowing electric current to flow to the corner portions. In order to prevent this unfavorable phenomenon, the space between the signal wiring and the opposed dielectric layer should be set to about 10 µm. In the embodiment shown in FIG. 12, these opposed dielectric layers are connected with each other via a column 9 and a solder 10.

Figure 13:
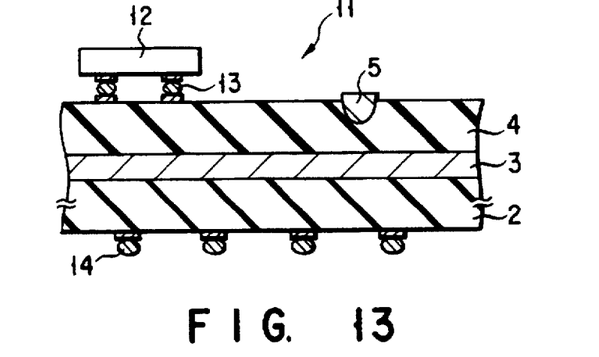
FIG. 13 is a cross-sectional view showing one example of a semiconductor module according to this invention.

The wiring board according to this invention may be fabricated into a semiconductor module by mounting a semiconductor element 12 on the dielectric layer 4 via a solder bump 13 as shown in FIG. 13. In this case, the substrate 2 may be mounted on a module substrate (not shown) via solder bumps 14 formed on the underside of the substrate 2.

Figure 14:
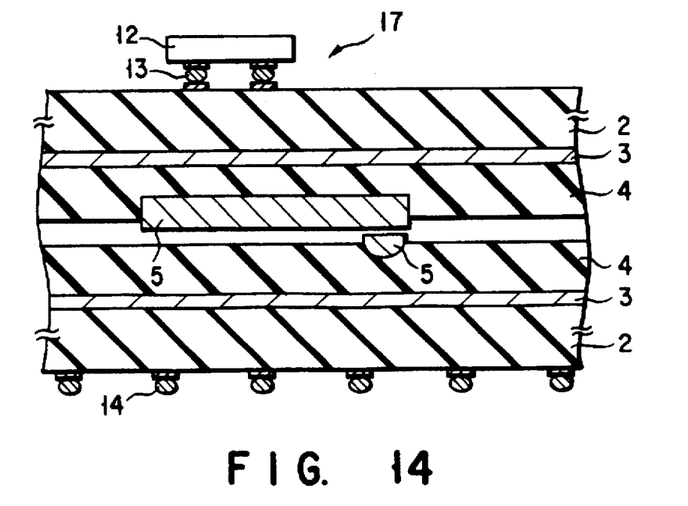
FIG. 14 is a cross-sectional view showing another example of a semiconductor module according to this invention.

The wiring board according to this invention may be applied to a double-strip line type wiring. FIG. 14 shows a cross-sectional view of one example of a semiconductor module employing a wiring board having a double-strip structure. The semiconductor module 17 shown in FIG. 14 comprises a pair of wiring board components shown in FIG. 4, which are arranged in such a manner that these wiring board components face each other with a space being interposed therebetween and that the directions of the signal wirings of both wiring board components orthogonally intercross with each other. On the surface of the upper substrate 2 is mounted a semiconductor element 12 via a solder bump 13. This semiconductor module can be mounted on a module substrate (not shown) via other solders bumps 14 formed on the underside of the lower substrate 2.

In the above example, the ground layer 3 is formed between the substrate 2 and the dielectric layer 4. However, the wiring board of this invention is not confined to this structure. For example, the ground layer may be formed within the substrate 2, or between the substrate and the air atmosphere.

Figure 15:
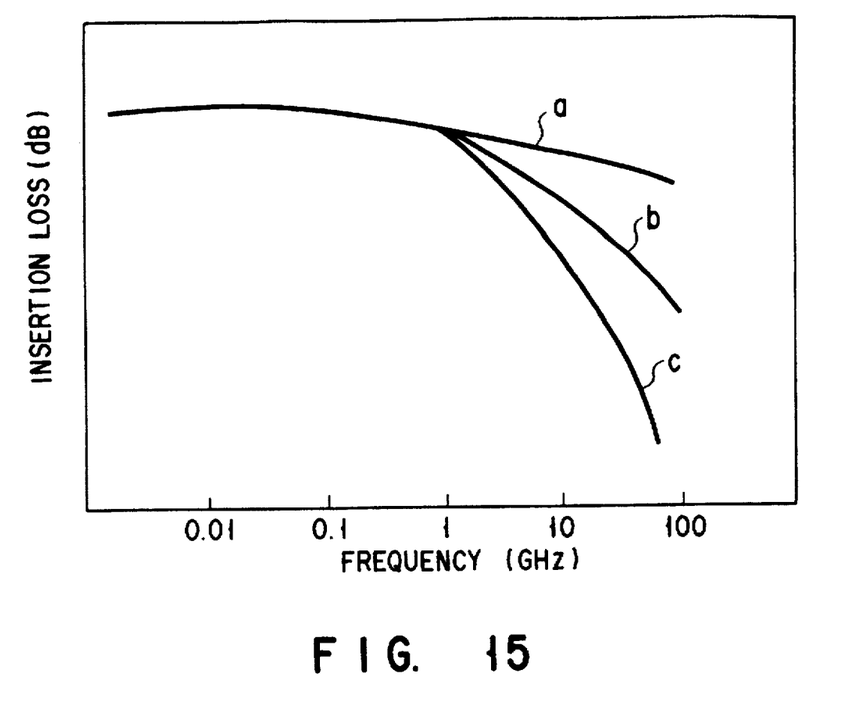
FIG. 15 is a graph showing an electric property of a wiring board.

The electric properties of the wiring board of this invention shown in FIG. 4 and of the wiring board of the conventional wiring board were measured, the results being shown in FIG. 15. The electric properties in this case were evaluated by measuring the insertion loss (S parameter) by means of vector network analyzer.

In the manufacture of wiring board of this invention, the aforementioned process was employed while setting $H_1$ and $H_2$ to 100 nm and 4 µm respectively, and setting the width of signal wiring to 20 µm. On the other hand, the wiring board shown in FIG. 1 was manufactured by forming a signal wiring 20 µm in line width and 4 µm in film thickness on the dielectric layer. Further, a copper thin film 1 µm in film thickness was formed by means of a sputtering method so as to be deposited only inside of the groove 20 µm in width and 4 µm in depth, which had been preliminarily formed in the dielectric layer, thereby manufacturing a wiring board having a structure shown in FIG. 2.

In FIG. 15, the curve "a" indicates a result obtained from the wiring board of this invention, while the curves "b" and "c" indicate results obtained from the wiring boards shown in FIG. 2 and FIG. 1, respectively. According to the conventional wiring board (the curve "c"), the insertion loss was prominently increased as the frequency was increased, whereas in the case of the wiring board of this invention (the curve "a"), it indicated the smallest insertion loss, thus indicating an excellent electric property thereof.

The wiring board of this invention has been explained with reference to specific examples as described above. However, this invention is not construed to be limited to these specific examples. For example, other kinds of dielectric material such as polyimide, epoxy resin and $SiO_2$ may also be employed depending on the frequency to be employed. If a resin such as polyimide and epoxy resin is to be employed, the groove for burying a signal wiring may be formed by making use of the development of a photosensitive material for instance. On the other hand, if $SiO_2$ is to be employed, the groove for burying a signal wiring may be formed by a dry etching method which enables an isotropic etching such as a CDE (Chemical Dry Etching) method.

As for the materials for the wiring board, not only copper, but also other metals which are high in conductivity such as gold and aluminum may be employed. As for the materials for the signal wiring, a multi-layered structure consisting of any of the aforementioned metals and any of titanium, chromium and nickel may be employed with a view to improve the adhesion strength.

Figure 16:
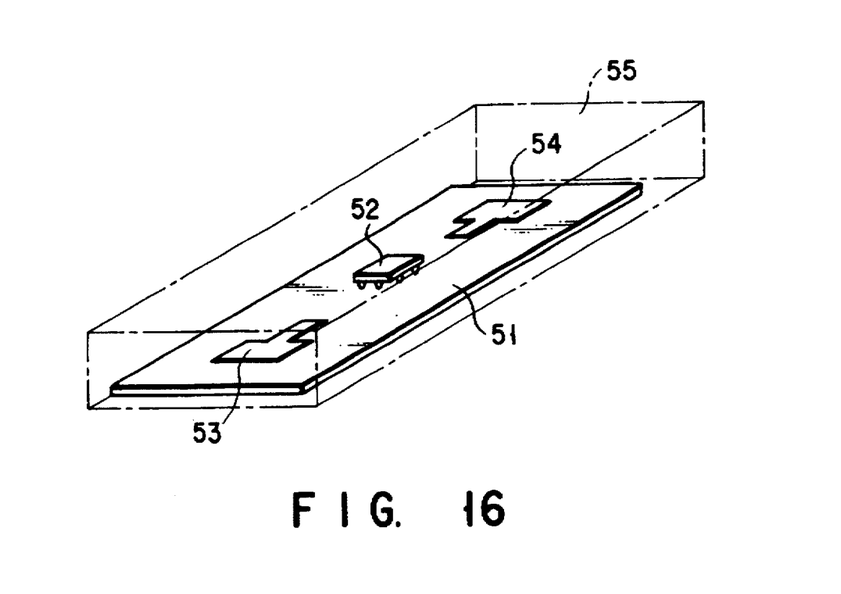
FIG. 16 is a perspective view showing one example of millimetric wave band transmitter-receiver module comprising a wiring board of this invention and a MMIC (monolithic microwave IC).

The advantages of the wiring board of this invention may be most conspicuously displayed when it is applied to a high-frequency module of microwave band or more. The wiring board of this invention is also applicable to the wiring of MMIC (monolithic microwave IC), i.e., the wiring of MMIC can be formed in the same manner as in the case of forming a wiring board. FIG. 16 shows one example of millimetric wave band transmitter-receiver module which is formed with the wiring board formed by the method of this invention and the MMIC. In FIG. 16, the reference numeral 51 denotes a wiring board, 52 an MMIC, 53 a transmitting antenna, 54 a receiving antenna, and 55 a case.

As explained above, it is possible according to this invention to prominently minimize a conductor loss which is one of most important properties of high frequency properties. Additionally, it is possible according to this invention to concurrently form a high-frequency signal wiring and the DC wiring in the same manufacturing step, thus allowing these wirings to coexist in the same layer. Therefore, it is possible according to this invention to decrease the number of manufacturing steps and at the same time to improve the yield of product, thereby saving the manufacturing cost thereof.

The wiring board of this invention is applicable to a substrate for an apparatus dealing with microwave and millimetric wave band as well as to an integrated circuit, and therefore is very valuable in an industrial viewpoint.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A wiring board for high-frequency signals, comprising:

a substrate;

a dielectric layer supported by said substrate and provided on its surface with a U-shaped elongated groove having an arcuate bottom for forming a signal wiring therein; and a signal wiring formed in said U-shaped elongated groove in such a manner that an upper end portion of said signal wiring is protruded out of the surface of said dielectric layer, wherein, said dielectric layer is supported by the surface of said substrate via a ground layer and said signal wiring is out of contact with said ground layer.

2. The wiring board for high-frequency signals according to claim 1, wherein a distance (H) from a protruded top surface of said signal wiring to a bottom of said U-shaped groove and a width (W) of said U-shaped groove meet the following formula (1):

$$2<(W/H)<50 \qquad (1).$$

3. The wiring board for high-frequency signals according to claim 2, wherein a distance (H) from a protruded top surface of said signal wiring to a bottom of said U-shaped groove and a width (W) of said U-shaped groove meet the following formula (2):

$$10<(W/H)<20 \qquad (2).$$

4. The wiring board for high-frequency signals according to claim 1, wherein a height of the portion of said signal wiring which is protruded out of the surface of said dielectric layer is in the range of 10 nm to 10 μm.

5. The wiring board for high-frequency signals according to claim 4, wherein a height of the portion of said signal wiring which is protruded out of the surface of said dielectric layer is in the range of 100 nm to 1 μm.

6. The wiring board for high-frequency signals according to claim 1, wherein said signal wiring is formed of copper.

7. A wiring board for high-frequency signals, comprising:

a substrate;

a dielectric layer supported by said substrate and provided on its surface with a U-shaped elongated groove having an arcuate bottom for forming a signal wiring therein; and a signal wiring formed in said U-shaped elongated groove in such a manner that an upper end portion of said signal wiring is protruded out of the surface of said dielectric layer, wherein said U-shaped groove formed in said dielectric layer is completely filled with said signal wiring.

8. The wiring board of claim 7, wherein a distance (H) from a protruded top surface of said signal wiring to a bottom of said U-shaped groove and a width (W) of said U-shaped groove meet the following formula (1):

$$2<(W/H)<50 \qquad (1).$$

9. The wiring board of claim 8, wherein the distance (H) and the width (W) meet the following formula (2):

$$10<(W/H)<20.$$

10. The wiring board of claim 7, wherein a height of the portion of said signal wiring which is protruded out of the surface of said dielectric layer is in the range of 10 nm to 10 μm.

11. The wiring board of claim 10, wherein said height of the portion of said signal wiring which is protruded out of the surface of said dielectric layer is in the range 100 nm to 1 μm.

12. The wiring board of claim 7, wherein said signal wiring is formed of copper.

13. A wiring board for high-frequency signals, comprising:

a substrate;

a dielectric layer supported by said substrate and provided on its surface with a U-shaped elongated groove having an arcuate bottom for forming a signal wiring therein; and a signal wiring formed in said U-shaped elongated groove in such a manner that an upper end portion of said signal wiring is protruded out of the surface of said dielectric layer, wherein said U-shaped groove formed in said dielectric layer is completely filled with said signal wiring and wherein said dielectric layer is formed of a photo-sensitive benzocyclobutene resin.

14. The wiring board for high-frequency signals according to claim 13, wherein said signal wiring is formed of copper.

15. The wiring board for high-frequency signals according to claim 14, wherein said signal wiring is deposited via a chromium thin film in said U-shaped groove formed in said dielectric layer.

16. The wiring board for high-frequency signals according to claim 15, wherein a film thickness of said chromium thin film is in the range of 10 nm to 1 μm.

17. The wiring board for high-frequency signals according to claim 16, wherein a film thickness of said chromium thin film is in the range of 20 nm to 200 nm.

18. A wiring board for high-frequency signals, which comprises;

a substrate;

a photo-sensitive benzocyclobutene layer supported by said substrate and provided on its surface with a U-shaped groove having an arcuate bottom for forming a wiring therein;

a chromium thin film formed on said U-shaped groove of said photo-sensitive benzocyclobutene layer; and a signal wiring comprising copper and formed in said U-shaped groove in such a manner that an upper end portion of said signal wiring is protruded out of the surface of said photo-sensitive benzocyclobutene layer.

19. The wiring board for high-frequency signals according to claim 18, wherein a distance (H) from a protruded top surface of said signal wiring to a bottom of said U-shaped groove and a width (W) of said U-shaped groove meet the following formula (1):

$$2<(W/H)<50 \qquad (1).$$

20. The wiring board for high-frequency signals according to claim 19, wherein a distance (H) from a protruded top surface of said signal wiring to a bottom of said U-shaped groove and a width (W) of said U-shaped groove meet the following formula (2):

$$10<(W/H)<20 \qquad (2).$$

21. The wiring board for high-frequency signals according to claim 18, wherein a height of the portion of said signal wiring which is protruded out of the surface of said photo-sensitive benzocyclobutene layer is in the range of 10 nm to 10 μm.

22. The wiring board for high-frequency signals according to claim 21, wherein a height of the portion of said signal wiring which is protruded out of the surface of said photo-sensitive benzocyclobutene layer is in the range of 100 nm to 1 μm.

23. A wiring board for high-frequency signals, comprising:

a first wiring substrate comprising,
a first substrate,
a first dielectric layer formed on said first substrate and provided on a surface thereof with a U-shaped groove having an arcuate bottom for forming a wiring therein, and
a first signal wiring formed in said U-shaped groove in such a manner that an upper end portion of said first signal wiring is protruded out of the surface of said first dielectric layer; and a second wiring substrate comprising
a second substrate,
a second dielectric layer formed on said second substrate and provided on a surface thereof with a U-shaped groove having an arcuate bottom for forming a wiring therein, and
a second signal wiring formed in said U-shaped groove in such a manner that an upper end portion of said second signal wiring is protruded out of the surface of said second dielectric layer;

wherein said upper end portion of said first signal wiring is disposed so as to face said upper end portion of said second signal wiring and to be separated from said second signal wiring and said second dielectric layer.

24. A wiring board for high-frequency signals, comprising;

a substrate;

a perfluorobenzocyclobutane layer formed on said substrate and provided on its surface with a U-shaped groove having an arcuate bottom for forming a wiring therein;

a chromium thin film formed on said U-shaped groove of said perfluorobenzocyclobutane layer; and a signal wiring comprising copper and formed in said U-shaped groove in such a manner that an upper end portion of said signal wiring is protruded out of the surface of said perfluorobenzocyclobutane layer.

25. The wiring board for high-frequency signals according to claim 24, wherein a distance (H) from a protruded top surface of said signal wiring to a bottom of said U-shaped groove and a width (W) of said U-shaped groove meet the following formula (1):

$$2<(W/H)<50 \qquad (1).$$

26. The wiring board for high-frequency signals according to claim 25, wherein a distance (H) from a protruded top surface of said signal wiring to a bottom of said U-shaped groove and a width (W) of said U-shaped groove meet the following formula (2):

$$10<(W/H)<20 \qquad (2).$$

27. The wiring board for high-frequency signals according to claim 24, wherein a height of the portion of said signal wiring which is protruded out of the surface of said perfluorobenzocyclobutane layer is in the range of 10 nm to 10 μm.

28. The wiring board for high-frequency signals according to claim 27, wherein a height of the portion of said signal wiring which is protruded out of the surface of said perfluorobenzocyclobutane layer is in the range of 100 nm to 1 μm.

29. A semiconductor module for high-frequency signals, comprising:

a substrate provided on an underside surface thereof with a first conductive mounting mechanism;

a dielectric layer formed on said substrate and provided on a surface thereof with a U-shaped groove having an arcuate bottom for forming a wiring therein;

a semiconductor element mounted on said dielectric layer via a second conductive mounting mechanism; and a signal wiring formed in said U-shaped groove in such a manner that an upper end portion of said signal wiring is protruded out of the surface of said dielectric layer, wherein said dielectric layer is supported by the surface of said substrate via a ground layer.

30. A semiconductor module for high-frequency signals, comprising:

a substrate provided on an underside surface thereof with a first conductive mounting mechanism;

a dielectric layer formed on said substrate and provided on a surface thereof with a U-shaped groove having an arcuate bottom for forming a wiring therein;

a semiconductor element mounted on said dielectric layer via a second conductive mounting mechanism; and a signal wiring formed in said U-shaped groove in such a manner that an upper end portion of said signal wiring is protruded out of the surface of said dielectric layer, wherein said U-shaped groove formed in said dielectric layer is completely filled with said signal wiring.

\* \* \* \* \*